Sept. 20, 1960 R. L. BRIGHT 2,953,738

RECTIFIER DEVICE

Filed June 2, 1954

WITNESSES:
E. A. McCloskey
Leon M. Garman

INVENTOR
Richard L. Bright.
BY F. P. Lyle
ATTORNEY

United States Patent Office 2,953,738

Patented Sept. 20, 1960

2,953,738

RECTIFIER DEVICE

Richard L. Bright, Adamsburg, Pa., assignor to Westinghouse Electric Corporation, East Pittsburgh, Pa., a corporation of Pennsylvania Filed June 2, 1954, Ser. No. 433,875

2 Claims. (Cl. 321—47)

The present invention relates to semiconductor rectifier devices, and more particularly to a rectifier circuit employing a transistor to effect rectification with low loss and low leakage current.

Semiconductor rectifiers of the diode type are in general use. Rectifiers of this type consist of a body of semiconductor material, such as germanium or silicon, which has adjoining regions of material of opposite conductivity types. That is, a portion of the material is of n-type, having an excess of electrons, and an adjoining portion of the material is of p-type, having a deficiency of electrons in its crystal structure resulting in so called holes which act as positive charge carriers. The junction between these two zones of opposite conductivity types functions as a rectifying barrier which permits current flow from the p-type zone to the n-type zone, but presents a very high resistance to current flow in the opposite direction.

These semiconductor diode rectifiers have many desirable characteristics, but they also have certain disadvantages. There is a rather definite maximum temperature at which these devices can be operated, and if this temperature is exceeded, the leakage current increases quite rapidly, so that the device loses its rectifying characteristics and may be damaged or destroyed by the overheating due to the excessive leakage current. This temperature limit is of the order of 60° C. for germanium, which is undesirably low, and silicon also has a quite definite, although higher, temperature limit. Another disadvantage of diode rectifiers is that they cannot be used at very low voltages, because the rectification ratio becomes quite low at low voltages and satisfactory rectification cannot be obtained.

The principal object of the present invention is to provide a rectifying circuit using a semiconductor device which can be operated at temperatures greatly in excess of the maximum permissible temperature for diode rectifiers.

Another object of the invention is to provide a rectifying circuit using a semiconductor device which has extremely low forward voltage drop and extremely low leakage current, and which can be operated at very low voltages without losing its rectifying characteristics.

More specifically, a rectifier circuit is provided utilizing a transistor connected in a series circuit with an alternating current source and controlled in synchronism with the voltage of the source in such a manner that the transistor alternately conducts and is cut off on successive half cycles of the voltage of the source, so that a unidirectional current flows in the circuit and very effective rectifying action is obtained.

Figure 1:
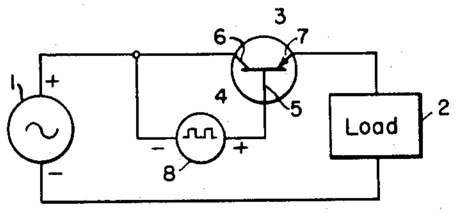

Other objects and advantages of the invention will be apparent from the following detailed description, taken in connection with the accompanying drawing, in which:

Figure 1 is a schematic diagram showing a preferred embodiment of the invention, and Figs. 2, 3, 4 and 5 are similar diagrams showing modified embodiments of the invention.

The circuit shown in Fig. 1 includes an alternating current source 1, which may be of any desired type and which is connected to supply a load 2. The load 2 may be a device or circuit of any type to which a direct current input is to be supplied. For the purpose of rectifying the output of the alternating current source 1, a transistor 3 is utilized. The transistor 3 may be of either the junction type or the point contact type, and is shown diagrammatically as including a body 4 of semiconductor material with a base electrode 5, a collector electrode 6 and an emitter electrode 7. The collector and emitter electrodes are connected in a series circuit with the alternating current source 1 to supply the load 2, which may be connected on either side of the transistor. A source of alternating control voltage 8 is provided and is connected, as shown, between the base electrode 5 and the collector electrode 6 of the transistor 3. The control voltage source 8 preferably produces a square voltage wave, as indicated on the drawing, and the voltage of the control source 8 has the same frequency as that of the source 1 and is synchronized with it. The control voltage source 8 may, for example, be an electronic oscillator of any suitable type, or it may be any other alternating voltage source which supplies a square wave and which can be accurately synchronized with the voltage of the source 1 by any suitable means.

To explain the operation of this circuit, it will be assumed that the transistor 3 is a p-n-p junction type transistor, consisting of a body of semiconductor material, such as germanium or silicon, having two zones of p-type material separated by an intermediate zone of n-type material. The base electrode 5 is connected to the intermediate n-type zone and the collector and emitter electrodes 6 and 7 are respectively connected to the p-type zones. If the base electrode 5 of such a device is made positive with respect to both the collector and emitter electrodes, no current can flow through the transistor, except an extremely small leakage current, because the base is biased in the reverse direction of both of the two p-n junctions, and the transistor is cut off. If the base is made negative with respect to either one of the other two electrodes, current can flow across the corresponding junction in the forward direction to the base, and the effect of this current is to unblock the other junction to permit current flow in the reverse direction across it, as in normal transistor operation. The transistor is then conducting and current can flow between the collector and emitter electrodes.

Referring now to Fig. 1, if the instantaneous polarities of the alternating current source 1 and the control voltage source 8 are as shown, at a given instant, it will be seen that the base 5 of the transistor is positive with respect to both the collector and the emitter, and the transistor is therefore cut off so that no current can flow from the source 1 to the load 2, except for the small leakage current, and the circuit is effectively open, the voltage of the source 1 appearing across the transistor 3.

On the following half cycle, when the polarity of the source 1 reverses, the polarity of the control voltage 8 will reverse at the same instant, since it is synchronized with the source 1. The base 5 will then be negative with respect to the emitter 7 and, as explained above, the transistor 3 will conduct, so that current can flow from the source 1 to the load 2. The magnitude of the control voltage 8 is made such that the transistor is saturated, that is, the current between the collector and emitter is independent of the magnitude of the control voltage, and the forward voltage drop across the transistor is then very small, so that practically the entire voltage of the source 1 appears across the load 2.

It will be seen that as the polarities of the source 1 and control voltage 8 reverse on successive half cycles, the transistor 3 will alternately conduct and be cut off, so that current can flow to the load only during half cycles of one polarity. Thus, a unidirectional current is supplied to the load and very effective rectification is obtained.

This arrangement has numerous advantages. The transistor has very much lower leakage current than the ordinary diode rectifier, and has very low forward voltage drop, as compared to the ordinary diode. During the conducting periods, therefore, while the current may be quite high, the voltage across the transistor is extremely low so that the power dissipated in the transistor is small, while during the cut off periods, the voltage across the transistor may be high but the current is extremely small, so that again the power dissipated is very small. Since the transistor changes abruptly from one state to the other, as the square wave control voltage reverses polarity, the continuous power dissipation or loss in the transistor is very small and high efficiency is obtained.

The effect of these low losses is that the device can control large amounts of power without overheating, and it can also be operated at much higher temperatures than are permissible with semiconductor diodes. Thus, as indicated above, a germanium diode cannot safely be operated at temperatures much above 60° C., but a germanium transistor utilized for rectification in the manner described can safely be operated at much higher temperatures, which may be considerably in excess of 100° C. A similar large increase in the maximum temperature is obtained with silicon. This is a very important advantage of the invention, since the temperature limitation which has been a serious handicap to diode rectifiers is substantially eliminated.

In addition to the advantages mentioned above, which make this transistor rectifier circuit very desirable at high power levels, it has the further important advantage that it can be used at very low voltages. As previously explained, a diode rectifier does not have satisfactory rectifying characteristics at voltages less than about one volt. The transistor rectifier circuit described above, however, maintains a high rectification ratio and a substantially linear characteristic down to extremely low voltages, and can satisfactorily be used at less than one millivolt. Thus, this rectifying circuit is suitable for use in numerous applications, both for high power and for low voltage, where diode rectifiers have not been usable or have had serious limitations.

As previously described, the control voltage source 8 of Fig. 1 preferably supplies a square-wave voltage to cause the transistor to change abruptly from the conducting state to the nonconducting state. In many applications, however, a sinusoidal control voltage can be used with satisfactory results, and where this is possible, the control voltage can advantageously be obtained from the alternating current source which is to be rectified. This makes possible a material simplification since it eliminates the need for a separate control voltage source with means for synchronizing it with the voltage to be rectified.

Figure 2:
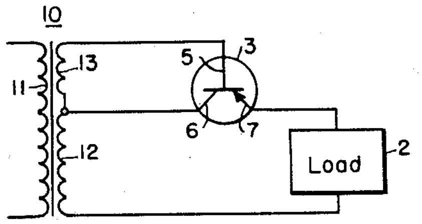

Such an arrangement is shown in Fig. 2, in which the load 2 is supplied from a transformer 10 having a primary winding 11 and the two secondary windings 12 and 13. The primary winding 11 is connected to an alternating current supply source and the secondary winding 12 is connected in a series circuit with the collector 6 and emitter 7 of the transistor 3 to supply the load 2. In this embodiment of the invention, the control voltage is supplied from the secondary winding 13 of the transformer 10, which is connected across the base 5 and collector 6 of the transistor 3. It will be obvious that the operation of this circuit is exactly the same as that of Fig. 1, except that the control voltage is obtained from the transformer which supplies the load and is therefore, in most cases, a sinusoidal voltage. This arrangement, however, is simpler than that of Fig. 1 because it eliminates the necesity of a separate source of synchronized control voltage. The operation and advantages of this circuit are the same as those discussed above in connection with Fig. 1.

Figure 3:
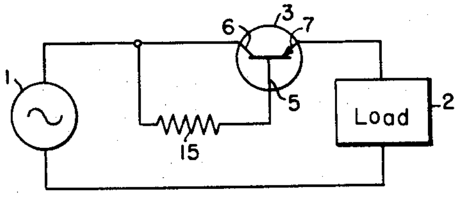

Fig. 3 shows still another embodiment of the invention which requires no separate control voltage source. In this embodiment, the control voltage is supplied by a resistor 15 connected across the base 5 and collector 6 of the transistor 3. It will be seen that since the voltage across this resistor is derived from the voltage of the source 1, it is necessarily in synchronism therewith, and that the operation of this circuit will be similar to that of the circuits described above, except that the losses may be somewhat greater because of the loss in the resistor 15. The operation and advantages, however, are the same as previously described.

It will be seen that in all the embodiments of the invention described, the base of the transistor is controlled in synchronism with the voltage source to be rectified to reverse the polarity of the base as the polarity of the source reverses, and that the base is thus maintained at the same polarity as the collector, in the particular embodiments shown. The control voltage could equally well be applied between the base and emitter, however, to maintain the base at the same polarity as the emitter, or, in general, the control voltage could be applied between any two of the three electrodes with one of those two and the third electrode connected in series with the source. The operation would be the same as described to change the transistor from conducting to nonconducting and back to conducting as the polarity of the source 1 reverses. It is also to be understood that, although the invention has been described above with reference to the operation of a p-n-p junction transistor, a transistor of the n-p-n type, or a point contact transistor, could be used in the same circuit. In general, a semiconductor device of any type having at least three electrodes can be used as a rectifier in the manner described with good results.

Figure 4:
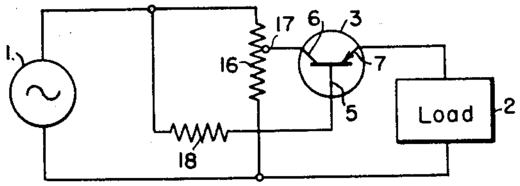

It will be apparent that various modifications of the circuit may be made within the scope of the invention. One such modification is shown in Fig. 4 which may be utilized to further reduce the leakage current, if desired. In this modification, a voltage divider or potentiometer 16 is connected across the alternating current source 1 and the collector 6 of the transistor 3 is connected to a suitable tap 17 on the voltage divider. The remainder of the circuit may be as previously described, and a resistor 18 is shown for providing the control voltage in the manner shown in Fig. 3, although it will be obvious that the control voltage could be supplied as shown in either Fig. 1 or Fig. 2. The effect of this connection is to reduce the voltage applied to the transistor 3 and load 2, and even a small reduction in the voltage will cause a substantial reduction in the leakage current so that the leakage, which is extremely small in any event, will be reduced to a practically negligible value. This connection also has the advantage of reducing the voltage which the transistor must withstand during the cut-off periods.

Figure 5:
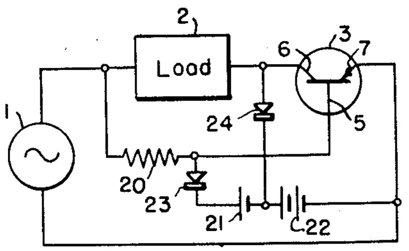

Fig. 5 shows another embodiment of the invention which includes means for limiting the maximum voltage across the transistor during cut off. In this circuit the transistor 3 and load 2 are connected in series with the source 1, as previously described, and the control voltage is supplied by a resistor 20 in the manner shown in Fig. 3, although it could equally well be supplied as shown in either Fig. 1 or Fig. 2. Two batteries 21 and 22, or other suitable unidirectional voltage sources, are connected as shown with the battery 21 across the collector and base electrodes, and the battery 22 across the collector and emitter electrodes, the two batteries being connected together so that their voltages add, and the polarity of the batteries being in a direction to oppose the voltage of the source 1 during the half cycles when the transistor 3 is cut off. Rectifiers 23 and 24 are connected in series with each of the batteries 21 and 22 in a direction to oppose current flow from the batteries. The rectifiers 23 and 24 may be semiconductor diodes, or they may be any other suitable type of electric valve means.

In the operation of this circuit, when the transistor 3 is cut off, the operatoin is as previously described until the instantaneous value of the voltage of the source 1 exceeds the sum of the voltages of the batteries 21 and 22. At this point, when the voltage of the source exceeds the battery voltage, current flows in the reverse direction through the batteries, the rectifiers 23 and 24 permitting current flow in this direction, and the transistor 3 is by-passed and protected from excessive voltages. On the following half cycle, when the transistor is conducting, the rectifiers 23 and 24 prevent current flow from the batteries 21 and 22. In this way the transistor is protected from being subjected to a voltage in excess of the sum of the voltages of the batteries 21 and 22, and can thus be utilized with a source 1 having a voltage which reaches a maximum value in excess of the maximum voltage which the transistor can safely withstand.

It will now be apparent that a rectifier circuit has been provided, utilizing a transistor for effecting rectification, which has outstanding advantages in very materially raising the temperature limitation which has been a serious handicap in the use of semiconductor rectifiers, in the low loss and low leakage current, and in the possibility of operation at very low voltages.

Certain specific embodiments of the invention have been shown and described, for the purpose of illustration, but it is to be understood that many modifications and other embodiments are within the scope of the invention. Thus, the control voltage has been described as being preferably a square-wave voltage synchronized with the voltage to be rectified. In some cases, however, it may be desirable to the shift the phase of the control voltage with respect to the voltage to be rectified so that the transistor conducts only during part of each half cycle of one polarity. It will also be apparent that, although a simple half-wave rectifying circuit has been shown, a plurality of transistors could be connected in a bridge circuit, and controlled as described, to effect full-wave rectification. The invention, therefore, is not limited to the specific embodiments shown but includes in its scope all equivalent modifications and embodiments.

I claim as my invention:

1. A rectifier device comprising a transistor having collector, emitter and base electrodes, a transformer having a primary winding and first and second secondary windings, means for connecting said collector and emitter electrodes in a series circuit including said first secondary winding, and means for connecting said second secondary winding across the base electrode and one of the other two electrodes.

2. A rectifier device comprising a transistor having collector, emitter and base electrodes, means for connecting said collector and emitter electrodes in a series circuit including an alternating current source, means for controlling the polarity of said base electrode with respect to the collector and emitter electrodes to reverse the polarity of the base electrode synchronously with the reversals of polarity of the voltage of said source, unidirectional voltage means connected across the electrodes of the transistor in a direction to limit the voltage applied to the transistor by said alternating current source, and electric valve means connected to block current flow from said unidirectoinal voltage means.

References Cited in the file of this patent

UNITED STATES PATENTS

| | | |
|---|---|---|
| 1,455,141 | Lowell et al. | May 15, 1923 |
| 1,674,298 | Powell | June 19, 1928 |
| 2,001,836 | Craig | May 21, 1935 |
| 2,263,269 | Hansell | Nov. 18, 1941 |
| 2,402,661 | Ohl | June 25, 1946 |
| 2,411,742 | Morack | Nov. 26, 1946 |
| 2,486,025 | Hilliard | Oct. 25, 1949 |
| 2,524,035 | Bardeen et al. | Oct. 3, 1950 |
| 2,582,850 | Rose | Jan. 15, 1952 |
| 2,614,140 | Kreer | Oct. 14, 1952 |
| 2,623,102 | Shockley | Dec. 23, 1952 |
| 2,698,392 | Herman | Dec. 28, 1954 |
| 2,728,857 | Sziklai | Dec. 27, 1955 |

OTHER REFERENCES

"Transistor Circuit Design" (Raisbeck), Electronics, December 1951, pages 128 through 132 and 134 relied on.